United States Patent
Su (10) Patent No.: US 11,468,963 B2
(45) Date of Patent: Oct. 11, 2022

(54) MEMORY DEVICE AND READ METHOD THEREOF

(71) Applicant: MACRONIX International Co., Ltd., Hsinchu (TW)

(72) Inventor: Chun-Lien Su, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/115,412

(22) Filed: Dec. 8, 2020

(65) Prior Publication Data

US 2022/0180961 A1 Jun. 9, 2022

(51) Int. Cl.
G11C 29/42 (2006.01)
G11C 29/44 (2006.01)
G11C 29/46 (2006.01)
G11C 29/52 (2006.01)

(52) U.S. Cl.
CPC .............. G11C 29/52 (2013.01); G11C 29/42 (2013.01); G11C 29/44 (2013.01); G11C 29/46 (2013.01)

(58) Field of Classification Search
CPC ......... G11C 29/52; G11C 29/42; G11C 29/44; G11C 29/46
USPC .................................................... 365/185.09
See application file for complete search history.

(56) References Cited

U.S. PATENT DOCUMENTS

| 6,421,274 B1 | 7/2002 | Yoshimura | |
| 2012/0204077 A1* | 8/2012 | D'Abreu | G06F 11/1012 714/755 |
| 2014/0169092 A1 | 6/2014 | Miyamoto et al. | |
| 2015/0046771 A1* | 2/2015 | Kim | H03M 13/1105 714/764 |
| 2017/0075759 A1 | 3/2017 | Otsuka | |
| 2017/0185328 A1* | 6/2017 | Li | G06F 3/0619 |

FOREIGN PATENT DOCUMENTS

| KR | 20150017948 A | * | 2/2015 | ........ H03M 13/3715 |
| TW | 201629773 A | * | 8/2016 | |
| TW | 201629980 A | * | 8/2016 | |
| WO | WO-2014133940 A1 | * | 9/2014 | ........ H03M 13/2942 |
| WO | WO-2020107301 A | * | 6/2020 | ............. G11C 29/42 |

OTHER PUBLICATIONS

"Office Action of Taiwan Counterpart Application", dated Jul. 26, 2021, pp. 1-7.

* cited by examiner

Primary Examiner — Ly D Pham
(74) Attorney, Agent, or Firm — J.C. Patents (57) ABSTRACT

A memory device and a read method thereof are provided. The read method of the memory cell array includes: reading a memory cell array to obtain page data; dividing the page data into a plurality of chunk data; performing a first error correction operation on each of the chunk data in sequence to respectively generate a plurality of first corrected chunk data; performing a second error correction operation on the page data to generate corrected page data; and outputting the corrected chunk data by referring to an indicating signal.

17 Claims, 7 Drawing Sheets

MEMORY DEVICE AND READ METHOD THEREOF

BACKGROUND

Technical Field

The disclosure relates to a memory device and a read method thereof, and in particular, to a memory device and a read method thereof capable of increasing a read speed.

Description of Related Art

In the related art, in the reading operation of non-volatile memory, the bottleneck of performance of the read operation lies in the time required to be consumed for performing an error correction operation. In theory, in the related art, in order to reduce the time required by the read operation, the read operation may be continuously performed on a plurality of memory pages. Moreover, after data of the previous memory page is read, since the next page address may be obtained in advance, the read operation may be further sped up.

Nevertheless, after the plural-bit error correction operation with complex scheme is applied to a memory device, the time required for each error correction operation becomes unexpected long. As such, when the read operation required to be continuously performed on memory pages in memory, the required read time is spent most of the time on the performance of the error correction operation, and thereby, efficiency of the read operation may not be enhanced.

SUMMARY

The disclosure provides a read method of memory capable of increasing a read speed.

A read method of memory provided by the disclosure includes the following steps: reading a memory cell array to obtain page data; dividing the page data into a plurality of chunk data; performing a first error correction operation on each of the chunk data in sequence to respectively generate a plurality of corrected chunk data; performing a second error correction operation on the page data to generate corrected page data; and outputting the corrected chunk data by referring to an indicating signal.

A memory device provided by the disclosure includes a memory cell array, a page buffer, a data register, a first error correction circuit, a second error correction circuit, a control logic, and a transmission interface. The page buffer is coupled to the memory cell array. The page buffer stores page data, and the page data is divided into a plurality of chunk data. The data register is configured to temporarily store the plurality of chunk data. The first error correction circuit is coupled to the data register and performs a first error correction operation on each of the chunk data in sequence to respectively generate a plurality of corrected chunk data. The second error correction circuit performs a second error correction operation on the page data to generate corrected page data. The control logic is coupled to the first error correction circuit and the second error correction circuit, configured to control the first error correction circuit and the second error correction circuit to respectively perform the first error correction operation and the second error correction operation. The transmission interface is coupled to the data register to output the plurality of corrected chunk data or the corrected page data by referring to an indicating signal.

To sum up, in the disclosure, the page data is divided into the plurality of chunk data with a small size. A faster error correction operation (the first error correction operation) is then performed on the plurality of chunk data in sequence and successive corrected chunk data can be read out immediately until an uncorrectable chunk data. A second error correction operation will intervene and take over correction and the followed read out data. In this way, since the performed error correction operation has a small error correction bit number, the time required for performing the error correction operation is decreased, and the read speed of memory is therefore increased. Further, if the corrected chunk data is not correct, it will resort to the second error correction operation of higher correction capability and a corrected page data can be provided to be a readout data. An accuracy for a readout operation of the memory device can be made sure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5A to FIG. 7C are waveform graphs illustrating read operations of the memory device respectively according to different embodiments of the disclosure.

DESCRIPTION OF THE EMBODIMENTS

Figure 1:
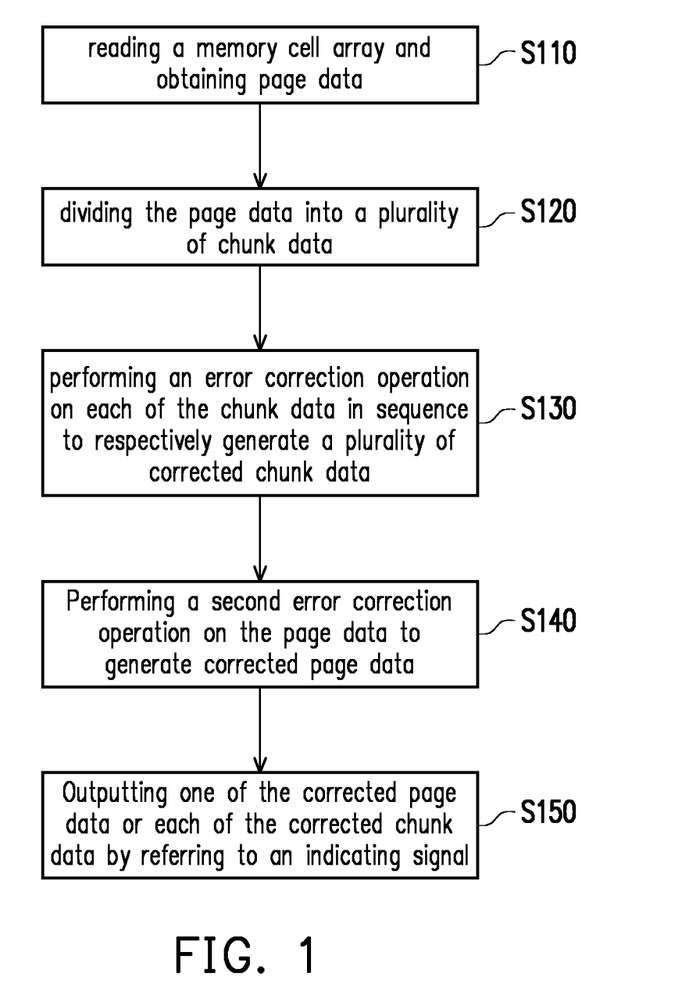
FIG. 1 is a flow chart illustrating a read method of memory according to an embodiment of the disclosure.

With reference to FIG. 1, FIG. 1 is a flow chart illustrating a read method of memory according to an embodiment of the disclosure. In step S110, a read operation is performed on a memory cell array, and page data is read out from the memory cell array. Herein, the read operation in step S110 may be performed on one memory page in the memory cell array to accordingly read one piece of page data. In detail, a page address may be generated in advance, a selected memory page is selected from the memory cell array according to the page address, and the read operation is performed on the selected memory page. A sensing operation may be performed on data sent from the selected memory page through a sense amplifier to generate the page data. In the present embodiment, the page data has, for example, 2K or 4K bytes.

Next, in step S120, the read page data is divided into a plurality of chunk data. In the present embodiment, the page data may be evenly divided into a plurality of chunk data with a small size. In the present embodiment, each piece of chunk data has, for example, 256 bytes. If the page data is demonstrated as having 2K bytes, the page data may be divided into 8 chunk data in step S120, and If the page data is demonstrated as having 4K bytes, the page data may be divided into 16 chunk data in step S120.

In step S130, a first error correction (error correction code, ECC) operation is performed on the plurality of chunk data and corresponding parity data in sequence and a plurality of corrected chunk data are respectively generated. In the present embodiment, the first error correction operation in step S130 is performed on chunk data having a small size, the number of error bits that may occur in a single piece of chunk data may not be large. As such, in the embodiments of the disclosure, the error correction operation with a small error correction bit number (e.g., 1 bit) may be performed on the chunk data in step S130, and time required for performance of the error correction operation is much accordingly decreased.

In this embodiment, the first error correction operation in step S130 may be implemented through the Hamming code manner or may be implemented through other error correction codes or algorithms known to a person of ordinary skill in the art, which is not particularly limited.

In step S140, when the first error correction operation fails, a second error correction operation can be performed on the page data and corresponding parity data to generate corrected page data. In this embodiment, a correction speed for the first error correction operation on each of the chunk data is faster than a correction speed of the second error correction on the page data. Besides, a correction capability for the first error correction operation on each of the chunk data is lower than a correction capability for the second error correction operation on the page data. For example, the second error correction operation may be performed according to the algorithm manner of the BCH code, the RS code, or the low-density parity-check code (LDPC code).

In step S150, one of the corrected page data or the plurality of corrected chunk data can be outputted by referring to an indicating signal to generate a readout data of the memory. In detail, if all of the corrected chunk data are correct, each of the corrected chunk data can be outputted to generate the readout data immediately. For example, data of a first chunk (chunk 0) can be corrected first, and corrected chunk data of chunk 0 can be outputted first. When the corrected chunk data of chunk 0 is outputted, data of a second chunk (chunk 1) can be corrected simultaneously. Such as that, corrected chunk data can be outputted without latency. On the other hand, if a first uncorrectable chunk data is occurred, the corrected page data can be selected to be the readout data. Furthermore, the memory can generate the indicating signal to indicate whether the readout data is ready or not. The readout data can be sent out from the memory based on the indicating signal.

In here, steps S130 and S140 can be performed simultaneously or in sequence. The indicator signal may be a standalone signal. The standalone signal means a signal that is dedicated to be used as the indicator signal. Specifically, in addition to utilizing the data strobe signal DQS, the chip select signal CS # and/or other signals that have a specific use or function as the indicator signal, in some embodiments, a dedicated signal (or a signal without providing specific use) may be also utilized as the indicator signal. That is, the indicator signal may be a dedicated signal which is independently set up with indication function.

Figure 2:
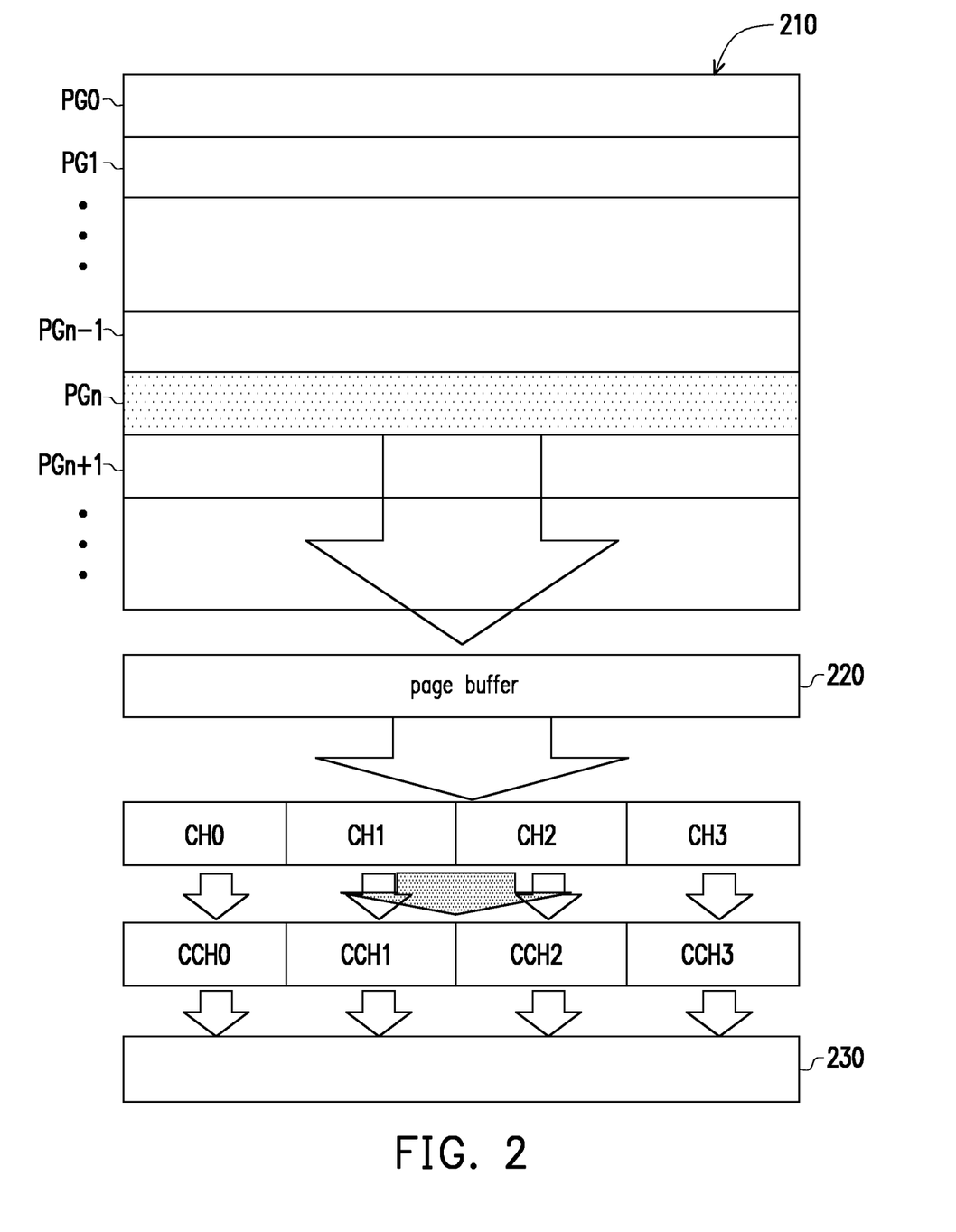
FIG. 2 is a schematic diagram illustrating an operation of the read method of memory according to an embodiment of the disclosure.

With reference to FIG. 2 below, FIG. 2 is a schematic diagram illustrating an operation of the read method of memory according to an embodiment of the disclosure. Herein, a memory cell array 210 has a plurality of memory pages PG0 to PGn+1. When the read operation is performed, the memory page PGn may be set to be the selected memory page. A read operation and a sensing operation on data may be performed on the selected memory page (the memory page PGn), so that page data stored in the memory page PGn may be accordingly obtained. In this embodiment, the page data may be temporarily stored in a page buffer 220. The page data stored in the page buffer 220 may be divided into a plurality of chunk data CH0 to CH3.

The chunk data CH0 to CH3 may be provided in sequence to perform the error correction operation, and corrected chunk data CCH0 to CCH3 are generated in sequence. The corrected chunk data CCH0 to CCH3 may be transmitted to a transmission interface 230, so that corrected page data formed by the corrected chunk data CCH0 to CCH3 is sent to act as readout data.

In this embodiment, the memory cell array 210 may be a non-volatile memory cell array, such as a flash memory cell array.

Certainly, a single piece of page data being divided into four chunk data CH0 to CH3 in FIG. 2 is an example for illustration only, and the number of the chunk data in other embodiments of the disclosure may be determined by the designer him/herself and is not particularly limited.

Figure 3A:
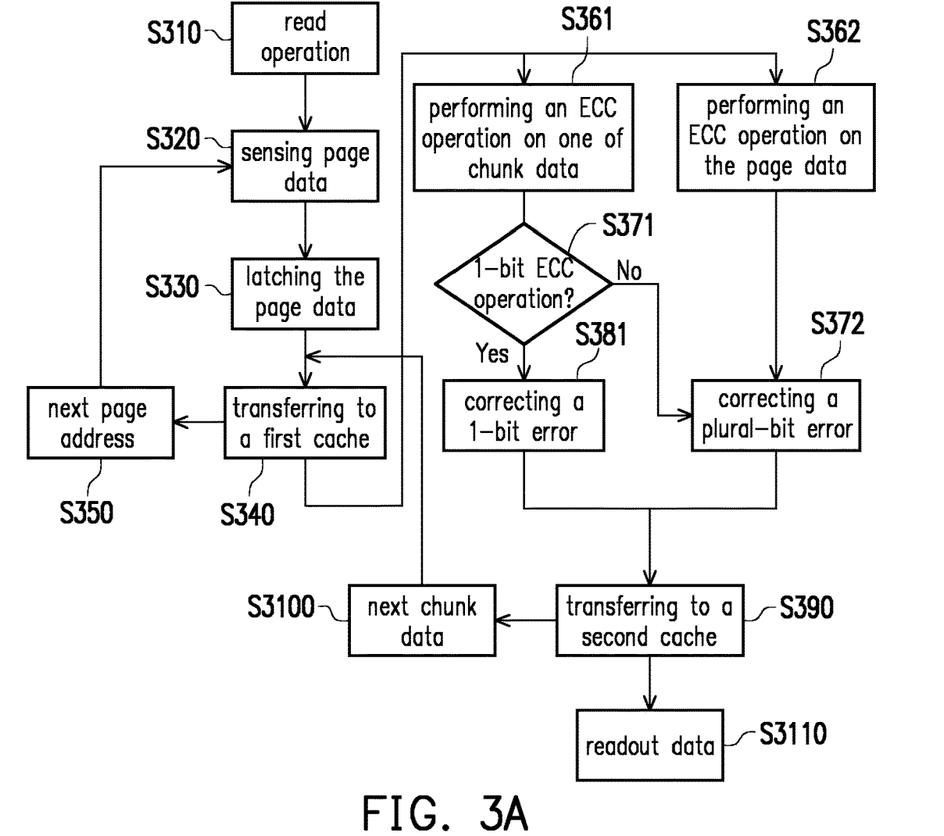
FIG. 3A and FIG. 3B are flow charts illustrating a read method of memory according to another embodiment of the disclosure.
Figure 3B:
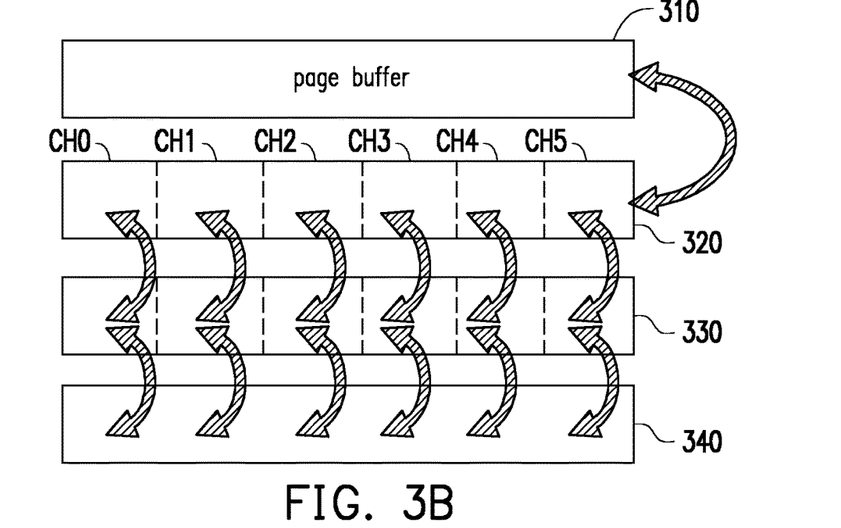

Referring to FIG. 3A and FIG. 3B below, FIG. 3A and FIG. 3B are flow charts illustrating a read method of memory according to another embodiment of the disclosure. In step S310, the read operation is performed, and page data in one memory page (e.g., the $N^{th}$ memory page) is sensed through the sensing operation performed by the sense amplifier. In step S330, the page data is latched in a data storage device such as the page buffer 310. The page data is transferred into a first cache 320 in step S340, and a selected page address is changed to a next page address in step S350. Herein, in the first cache 320, the page data may be divided into a plurality of chunk data CH0 to CH5.

Next, an error correction (ECC) operation is performed on one piece of chunk data CH0 to CH5 in sequence in step S361, and it is then determined that whether performance of the error correction operation on each piece of chunk data CH0 to CH5 may be completed through the 1-bit ECC operation (step S371). If Yes is determined, step S381 is performed, and if No is determined, step S372 is performed instead. Herein, an error correction bit number of the ECC operation performed in step S361 is 1.

Note that in the present embodiment, another ECC operation is simultaneously performed on the page data stored in the page buffer 310 in step S362, and the ECC operation in step S362 may correct an error of plural bits in the page data.

In step S371, when the error bit number in any piece of chunk data is found to be greater than 1 and error correction may not be completed through the ECC operation in step S361, step S372 may then be performed to perform the error correction operation on the plural-bit error in the page data.

Through step S381, a plurality of corrected chunk data corresponding to the chunk data may be obtained in sequence, and corrected page data is accordingly obtained. Through step S372, the corrected page data may be directly obtained. In step S390, the corrected chunk data obtained in step S381 may be transferred into a second cache 330. Further, after step S390 is performed, next chunk data may be selected (step S3100) instead, and step S340 may then be performed again.

In step S390, it may also be the corrected page data obtained in step S372 is transferred to the second cache 330.

Moreover, in step S3110, the corrected page data in the second cache 330 may be read out to a transmission interface 340 to transmit readout data.

In order to speed up the read operation, when transmission of the page data into the first cache 320 performed in step S340 is completed, the selected page address may be changed to the next page address in step S350. Further, a read operation and a sensing operation may be performed on page data of a memory page (e.g., an N+1$^{th}$ memory page, or assigned by host in advance) of the next page address, and the page data of the N+1th memory page is stored in the page buffer 310.

In addition, in the embodiments of the disclosure, the different ECC operations performed in step S361 and S362 respectively may be simultaneously performed. Alternatively, performance of step S362 is started only when No is determined in step S371. The order of the steps is not particularly limited.

Incidentally, the ECC operation in step S361 may be performed according to the algorithm manner of the Hamming code, and the ECC operation in step S362 may be performed according to the algorithm manner of the BCH code, the RS code, or the low-density parity-check code (LDPC code). It should be noted here, the ECC operation in step S361 is always faster than the ECC operation in step S362.

It should be noted here, in step S3110, the readout data can be sent out from the memory by referring an indicating signal. The indicating signal can be generated based on whether the readout data is ready or not. Also, a data receiver of the memory can receive the readout data based on the indicating signal. Such as that, a data receiver (the host) can obtain the readout data correctly and immediately without data loss.

Figure 4:
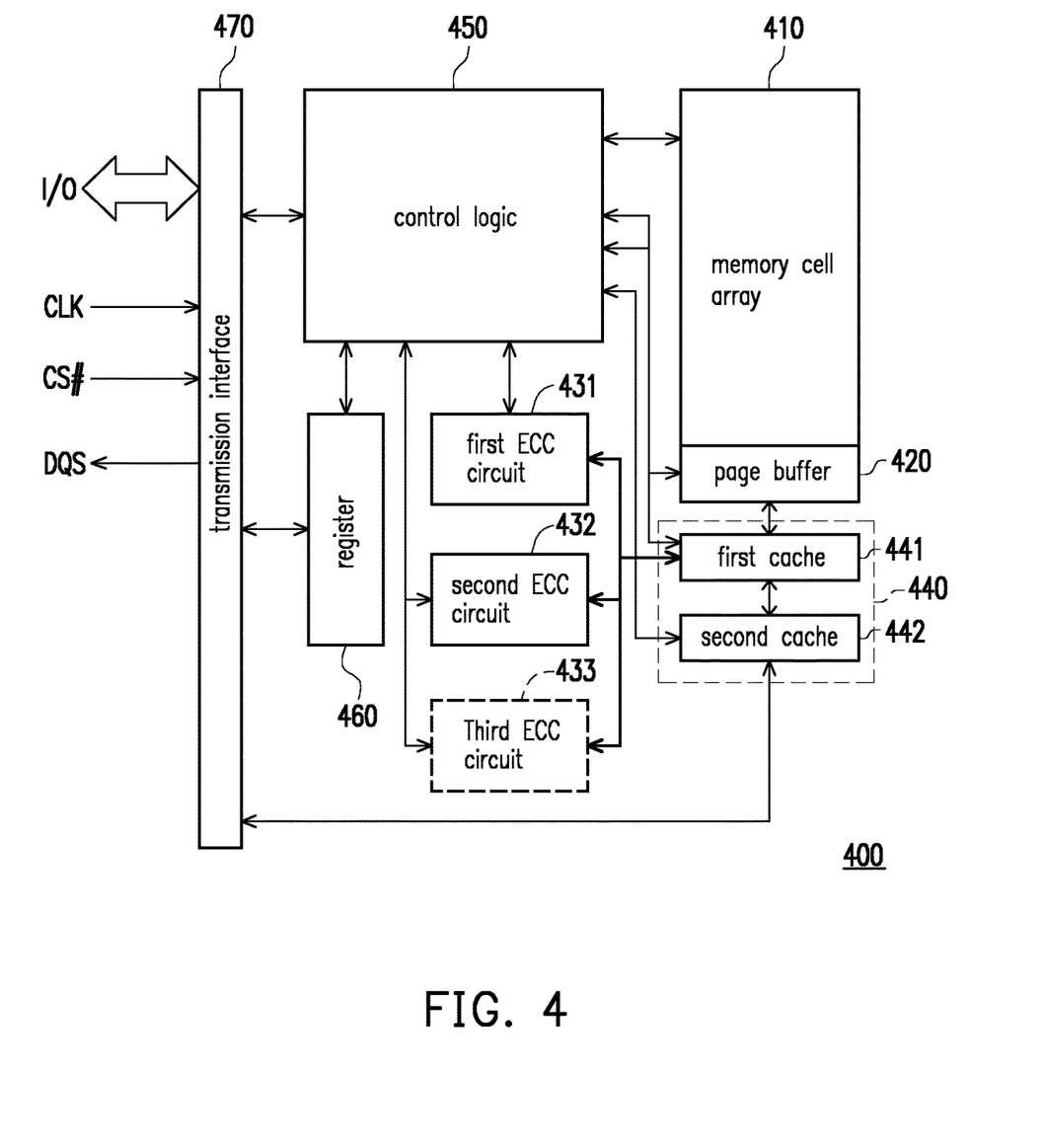
FIG. 4 is a schematic diagram illustrating a memory device according to an embodiment of the disclosure.

With reference to FIG. 4 below, FIG. 4 is a schematic diagram illustrating a memory device according to an embodiment of the disclosure. A memory device 400 includes a memory cell array 410, a page buffer 420, a first error correction code (ECC) circuit 431, a second ECC circuit 432, a data register 440, a control logic 450, a register 460, and a transmission interface 470. The memory cell array 410 has a plurality of memory pages and is coupled to the page buffer 420. When a read operation is performed on the memory cell array 410, one memory page in the memory cell array 410 may be selected for reading, and page data which is read out is temporarily stored in the page buffer 420. Herein, the page data may be divided into a plurality of chunk data.

The data register 440 is coupled to the page buffer 420. The data register 440 includes a first cache 441 and a second cache 442. The page data in the page buffer 420 may be transferred and stored in the first cache 441 first. Moreover, an ECC operation may be performed on each piece of chunk data in the first cache 441 in sequence by the first ECC circuit 431, and a plurality of corrected chunk data are generated in sequence. Each piece of corrected chunk data is stored into the second cache 442 and can be read out immediately in sequence.

On the other hand, if a first uncorrectable chunk data is occurred, the error correction operation may switch to the second ECC circuit 432. In this way, generation of the corrected page data for the remaining chunk data may be completed and then be outputted. In the present embodiment, a capability of the first ECC circuit 431 is less than a capability of the second ECC circuit 432. For instance, an error correction bit number of the first ECC circuit 431 may be 1 bit, and an error correction bit number of the second ECC circuit 432 may be plural bits greater than 1. On the other hand, a speed of the ECC operation on the chunk data is faster than a speed of the ECC operation on the page data. In this way, the correction operation of next chunk is able to finish during the readout of present chunk data outputting. And it then can output chunk data continuously without wait.

The control logic 450 is coupled to the memory cell array 410, the page buffer 420, the data register 440, the first ECC circuit 431, and the second ECC circuit 432. The control logic 450 may be configured to perform a data access operation on the memory cell array 410. The control logic 450 may also be configured to control a transfer operation on the chunk data in the first cache 441 and control starting time points of the first ECC circuit 431 and the second ECC circuit 432.

In some embodiment, the memory device 400 may further include a third ECC circuit 433. The third ECC circuit 433 is coupled between the control logic 450 and the data register 440. The third ECC circuit 433 can perform another error correction operation on the page data. The third ECC circuit 433 can correct more bits than the second ECC circuit 432.

In the present embodiment, the control logic 450 may be configured to perform the operation flow illustrated in FIG. 3, and related details are provided with reference to the description of embodiments of FIG. 3.

The control logic 450 is coupled to the register 460. The register 460 allows the control logic 450 to access register data and the control logic performs various operations according to the content of registers. The control logic 450 and the register 460 are coupled to the transmission interface 470. The transmission interface 470 receives and sends a data or command signal I/O, receives a clock signal CLK, transceiver an chip select signal CS #, and transmits a data strobe signal DQS.

The transmission interface 470 acts as a signal communication interface between the memory device 400 and an external electronic apparatus. The transmission interface 470 may be a parallel transmission interface, may be a serial transmission interface, or may be a transmission interface in both parallel and series. Note that in the embodiments of the disclosure, regarding the transmission protocol, the transmission interface of the memory device 400 is not particularly limited. In this embodiment, one of the chip select signal CS # and the data strobe signal DQS can be selected to be the indicating signal. The transmission interface 470 can inform the external electronic apparatus to receive the readout data. The indicating signal can be generated by the control logic 450 according to whether the readout data of chunks (or each chunk) is ready or not. In some embodiment, transmission interface 470 can provide another interrupt signal RDY/BY # rather than the chip select signal CS # and the data strobe signal DQS to be the indicating signal. In some embodiment, the RDY/BY # signal may be incorporated into an interrupt signal as a bit of interrupt status register.

Referring to FIG. 5A to FIG. 7C below, FIG. 5A to FIG. 7C are waveform graphs illustrating read operations of the memory device respectively according to different embodiments of the disclosure. In FIG. 5A to FIG. 7C, the memory device can work based on a clock signal SLCK.

Figure 5A:
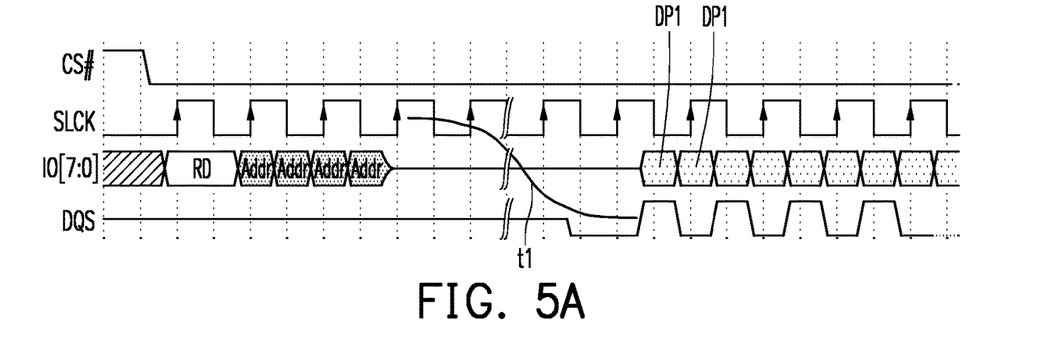
Figure 5B:
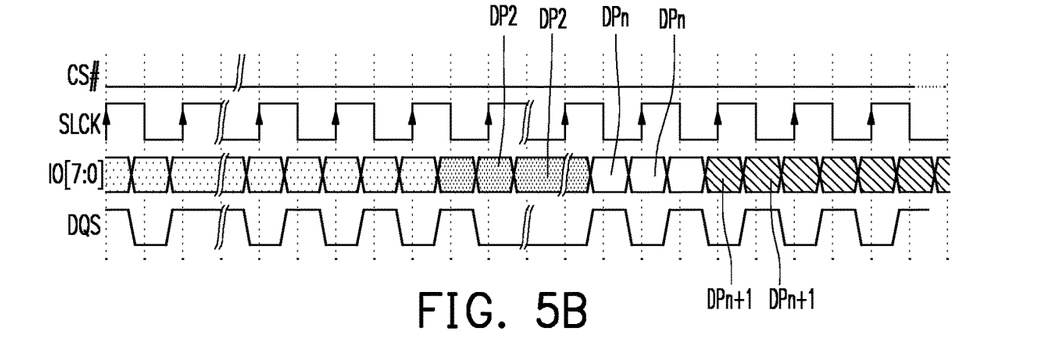
Figure 5C:
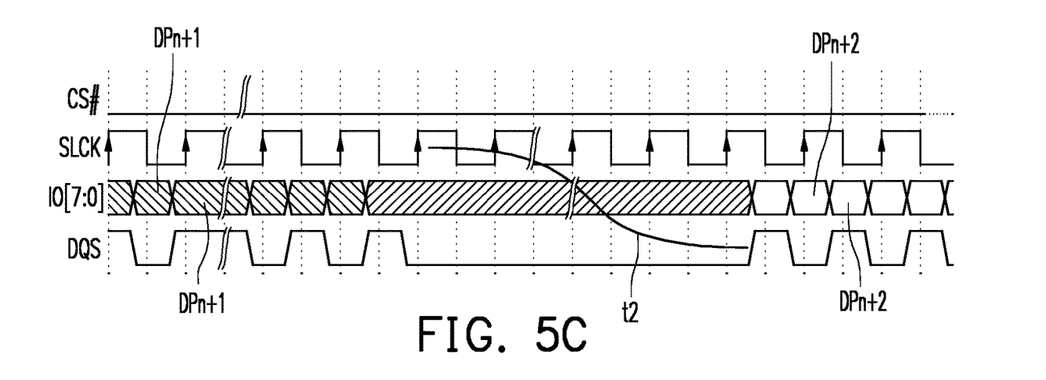

In the FIGS. 5A to 5C, the data strobe signal DQS is selected to be the indicating signal. Further, in FIG. 5A, a data reading command RD and corresponding address information Addr can be transported through a data or command signal IO[7:0] to the memory device from the host. Before readout data DP1 of a first chunk of a first page is ready, the data strobe signal DQS may be held in a static state low. After a delay time t1, ECC operation of the first chunk on the readout data DP1 has been finished without failure and the data strobe signal DQS starts to transit between high and low logic level. The host can receive the readout data DP1 of the first chunk of the first page corresponding to the data strobe signal DQS.

In FIG. 5B, readout data DP2-DPn of a second page to nth page can be readout continuously. Since the readout data DP2-DPn can be obtained by corrected chunk data with short error correction time, the readout data DP2-DPn can be sent out without time delay. The data strobe signal DQS can keep on toggling.

In FIG. 5C, after the readout data DPn+1 has been sent out, the data strobe signal DQS may keep low if an uncorrectable chunk is happened till the completion of the ECC operation of the page. The readout data DPn+2 of the uncorrectable chunk and the remaining chunk(s) of the page may continue with DQS toggling again once the ECC operation of the page is completed. In here, a longer delay time t2 is necessary for performing ECC operation on the page data. Then, readout data DPn+2 can be obtained according to corrected page data.

It can be seen, in present embodiment, the readout data can be sent out based on the indicating signal, and the host can obtain the readout data correctly. Also, the data strobe signal DQS can be dynamic adjusted based on which ECC operation is performed. And readout latency of the memory device can be known by the host.

Figure 6A:
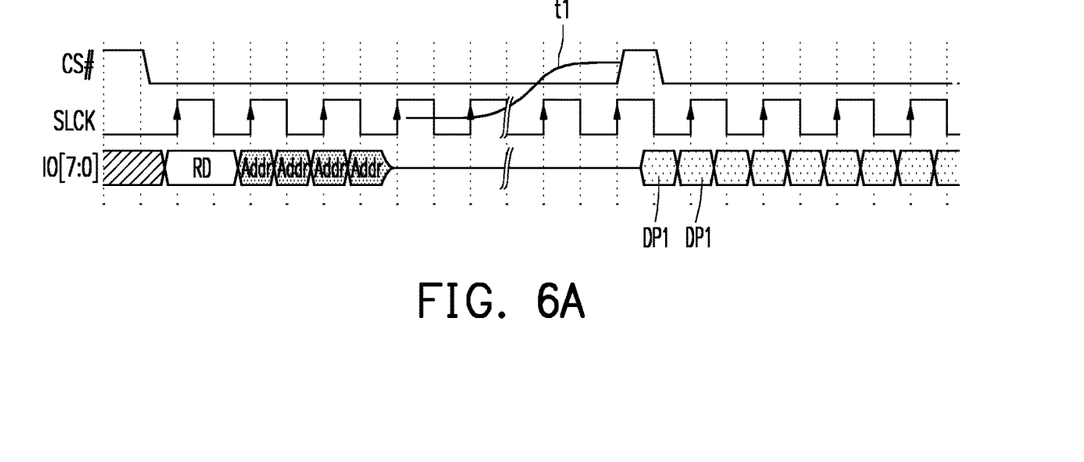
Figure 6B:
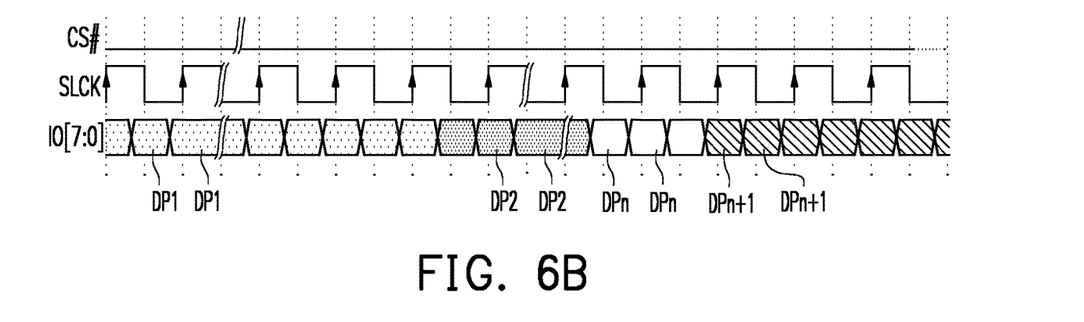
Figure 6C:
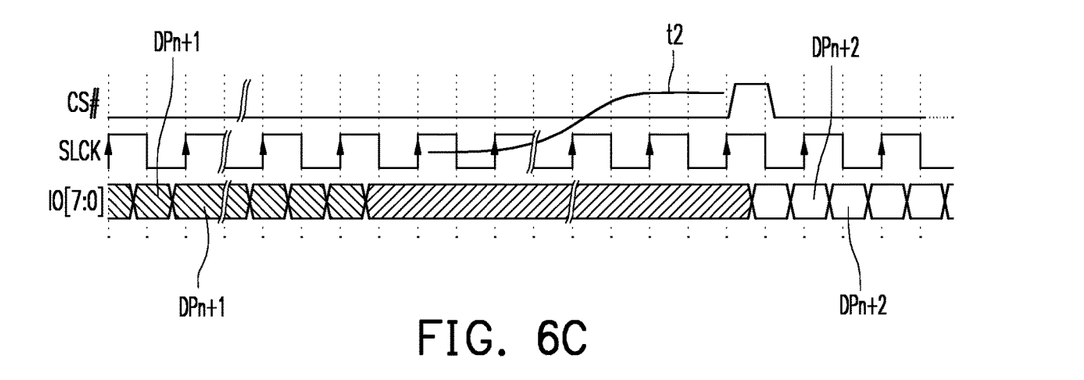

In the FIGS. 6A to 6C, an chip select signal CS # is selected to be the indicating signal. In this embodiment, when readout data is ready, a positive pulse can be generated on the chip select signal CS #, and the host can identify the positive pulse of the chip select signal CS # to receive the readout data. In FIG. 6A, a data reading command RD and corresponding address information Addr can be transported through a data or command signal IO[7:0] to the memory device from the host. Then, after a delay time t1, readout data DP1 is ready, and a positive pulse on the chip select signal CS # is generated. Such as that, the host can receive the readout data DP1 based on the clock signal SLCK.

In FIG. 6B, readout data DP1 to DPn+1 of continuous pages (from page 1 to page n+1) can be sent out according to corrected chunk data, and no more readout out latency is needed. The chip select signal CS # is held on a logic low level in FIG. 6B.

In FIG. 6C, after the readout data DPn+1 has been sent out, readout data DPn+2 of (n+2)th page is obtained from corrected page data. After a delay time t2, the host can identify another positive pulse on the chip select signal CS # to get the readout data DPn+2.

Figure 7A:
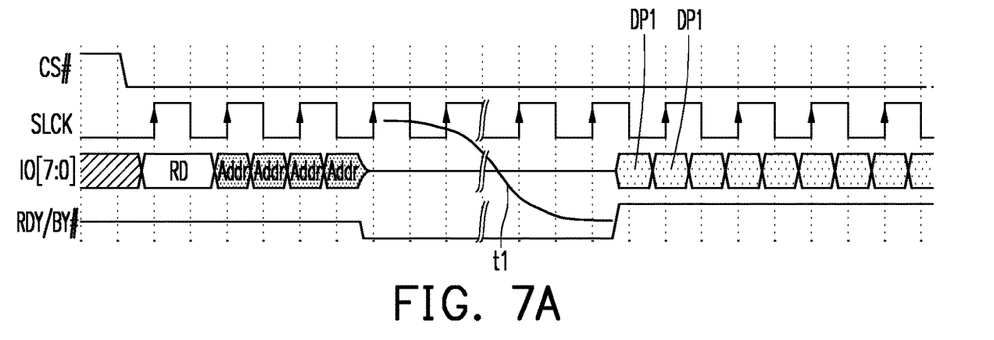
Figure 7B:
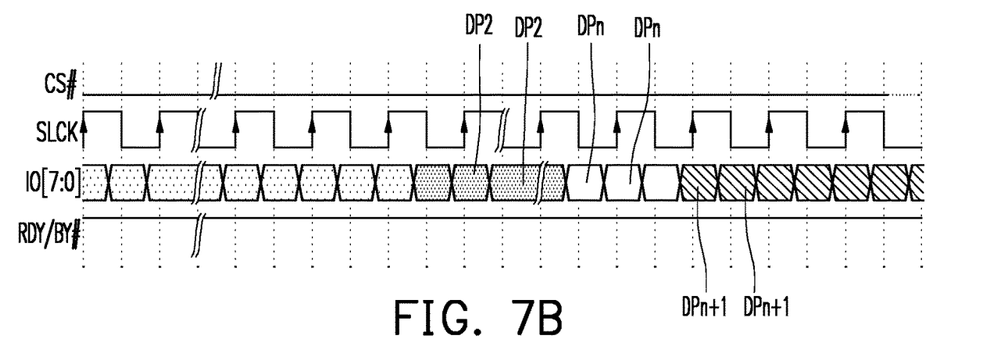
Figure 7C:
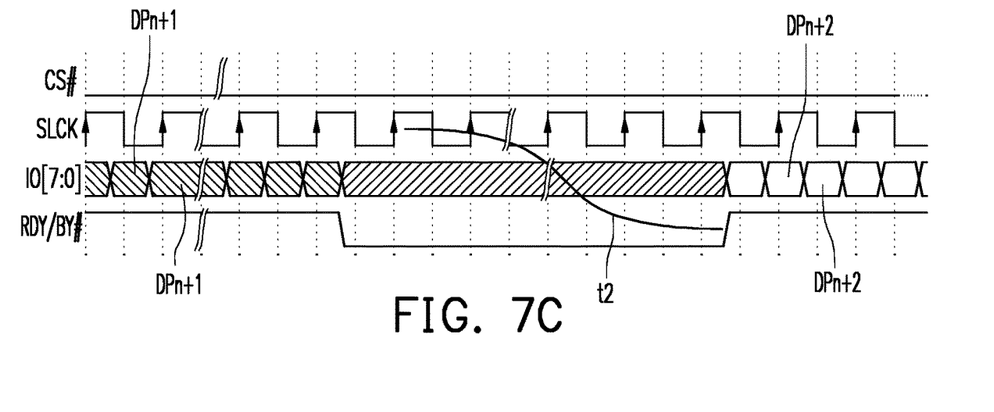

In the FIGS. 7A to 7C, an interrupt signal RDY/BY # is generated and selected to be the indicating signal. In this embodiment, the interrupt signal RDY/BY # is pulled to a logic low level to indicate readout data is not ready. On the other hand, the signal RDY/BY # is pulled to a logic high level to indicate readout data is ready and can be obtained based on the clock signal SLCK.

In FIG. 7A, a data reading command RD and corresponding address information Addr can be transported through a data or command signal IO[7:0] to the memory device from the host. Then, the interrupt signal RDY/BY # is pulled to the logic low level to inform the host that readout data DP1 is not ready. After a delay time t1, the interrupt signal RDY/BY # is pulled to the logic high level, and the host can receive the readout data DP1 of a first page of the memory device.

In FIG. 7B, readout data DP1 to DPn+1 of continuous pages (from page 1 to page n+1) can be sent out according to corrected chunk data, and no more readout out latency is needed. The interrupt signal RDY/BY # is held on the logic high level in FIG. 7B.

In FIG. 7C, after the readout data DPn+1 has been sent out, readout data DPn+2 of (n+2)th page is obtained from corrected page data, and the interrupt signal RDY/BY # is pulled to the logic low level to make a new readout latency. After a delay time t2, the interrupt signal RDY/BY # is re-pulled to the logic high level, and the host get the readout data DPn+1 based on the clock signal SLCK.

In view of the foregoing, in the disclosure, the page data is divided into a plurality of chunk data, so that the data size for performing the error correction operation is reduced. Moreover, through rapid performance, the first error correction operation with a low error correction bit number and higher speed may perform the error correction operation on each piece of chunk data. In this way, when the read operation of memory is performed, transmission delay of the readout data generated by the error correction operation may be prevented, so that operation efficiency of memory may be effectively enhanced. And an indicating signal is also provided to prompt the availability of data for different latency due to different error correction operation imposed. A host can obtain the readout data correctly based on the indicating signal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A read method of memory, comprising:
reading a memory cell array to obtain page data;
dividing the page data into a plurality of chunk data, wherein each chunk data is a portion of data in a page;
performing a first error correction operation on each of the chunk data in sequence to respectively generate a plurality of corrected chunk data;
outputting the corrected chunk data by referring to an indicating signal; and
performing a second error correction operation on the page data to generate a corrected page data when the first error correction operation fails, wherein the indicating signal is used as a data strobe signal, an interrupt signal or a chip select signal.

2. The read method according to claim 1, wherein a correction speed for each of the chunk data is faster than a correction speed of the page data.

3. The read method according to claim 1, wherein a correction capability of each of the chunk data is lower than a correction capability of the page data.

4. The read method according to claim 1, wherein a step of outputting the corrected chunk data by referring to the indicating signal comprises:
outputting the plurality of corrected chunk data till an uncorrectable chunk happens; and
outputting remaining chunk data after completion of the second error correction operation.

5. The read method according to claim 1, wherein the first error correction operation and the second error correction operation are performed simultaneously.

6. The read method according to claim 1, wherein the first error correction operation and the second error correction operation are performed in sequence.

7. The read method according to claim 1, wherein a first error correction bit number of the first error correction operation is 1 bit.

8. The read method according to claim 1, wherein the indicating signal is a dedicated signal which is independently set up with indication function.

9. The read method according to claim 1, further comprising:
performing a third error correction operation on an uncorrectable page data of the second error correction operation to generate the corrected page data; and
outputting the corrected page data by referring to the indicating signal,
wherein a correction capability of the third error correction operation is higher than a correction capability of the second error correction operation.

10. A memory device, comprising:
a memory cell array;
a page buffer, coupled to the memory cell array, storing page data, wherein the page data is divided into a plurality of chunk data and each chunk data is a portion of data in a page;
a data register, configured to temporarily store the plurality of chunk data; and
a transmission interface, coupled to the data register, outputting plurality of corrected chunk data by referring to an indicating signal, wherein the indicating signal is used as a data strobe signal, an interrupt signal or a chip select signal;
a first error correction circuit, coupled to the data register, performing a first error correction operation on each piece of chunk data in sequence to respectively generate the corrected chunk data;
a second error correction circuit, when the first error correction fails, performing a second error correction operation on the page data to generate corrected page data; and
a control logic, coupled to the first error correction circuit and the second error correction circuit, configured to control the first error correction circuit and the second error correction circuit to respectively perform the first error correction operation and the second error correction operation.

11. The memory device according to claim 10, wherein the data register further comprises:
a first cache, configured to temporarily store the plurality of chunk data; and
a second cache, configured to temporarily store the plurality of corrected chunk data or the corrected page data.

12. The memory device according to claim 10, wherein the transmission interface outputs the plurality of corrected chunk data till an uncorrectable chunk happens, and the transmission interface outputs remaining chunk data after the completion of the second error correction operation.

13. The memory device according to claim 10, wherein a correction speed of the first error correction circuit for correcting each of the chunk data is faster than a correction speed of the second error correction circuit for correcting the page data.

14. The memory device according to claim 10, wherein a correction capability of the first error correction circuit is lower than a correction capability of the second error correction circuit.

15. The memory device according to claim 10, wherein the first error correction operation and the second error correction operation are performed simultaneously or in sequence.

16. The memory device according to claim 10, further comprising:
a third error correction circuit, performing a third error correction operation on the corrected page data to generate a second corrected page data.

17. The memory device according to claim 10, wherein the control logic further generates the indicating signal to indicate whether a readout data of the memory device is ready or not.

* * * * *